(12) United States Patent
Mizuno

(10) Patent No.: US 8,432,303 B2
(45) Date of Patent: Apr. 30, 2013

(54) ELECTRONIC APPARATUS AND CONTROL METHOD OF THE SAME

(75) Inventor: Masanaka Mizuno, Shizuoka-ken (JP)

(73) Assignees: Kabushiki Kaisha Toshiba, Tokyo (JP); Toshiba Tec Kabushiki Kaisha, Tokyo (JP)

(*) Notice: Subject to any disclaimer, the term of this patent is extended or adjusted under 35 U.S.C. 154(b) by 86 days.

(21) Appl. No.: 13/206,387

(22) Filed: Aug. 9, 2011

(65) Prior Publication Data

US 2012/0038399 A1    Feb. 16, 2012

Related U.S. Application Data

(60) Provisional application No. 61/372,414, filed on Aug. 10, 2010.

(51) Int. Cl.
*H03M 9/00* (2006.01)

(52) U.S. Cl.
USPC .......................................... 341/101; 341/100

(58) Field of Classification Search ........... 341/100–101
See application file for complete search history.

(56) References Cited

U.S. PATENT DOCUMENTS

| 6,529,148 | B1 * | 3/2003 | Maddux ......................... 341/100 |
| 6,768,431 | B2 * | 7/2004 | Chiang .......................... 341/100 |
| 7,528,748 | B2 * | 5/2009 | Ohara ............................ 341/101 |
| 7,675,439 | B2 * | 3/2010 | Chang et al. .................. 341/100 |

FOREIGN PATENT DOCUMENTS

| JP | 4-186984 | 7/1992 |
| JP | 5-130349 | 5/1993 |

* cited by examiner

*Primary Examiner* — Khai M Nguyen
(74) *Attorney, Agent, or Firm* — Patterson & Sheridan, LLP

(57) ABSTRACT

According to one embodiment, an electronic apparatus non-masks a clock signal portion used for shift-outputting respective digital signals by first parallel/serial converting device and masks the remaining clock signal portion, in the clock signal supplied to the first and second parallel/serial converting devices, in a first mode. The apparatus non-masks the clock signal supplied to the first and second parallel/serial converting devices, in a second mode.

20 Claims, 8 Drawing Sheets

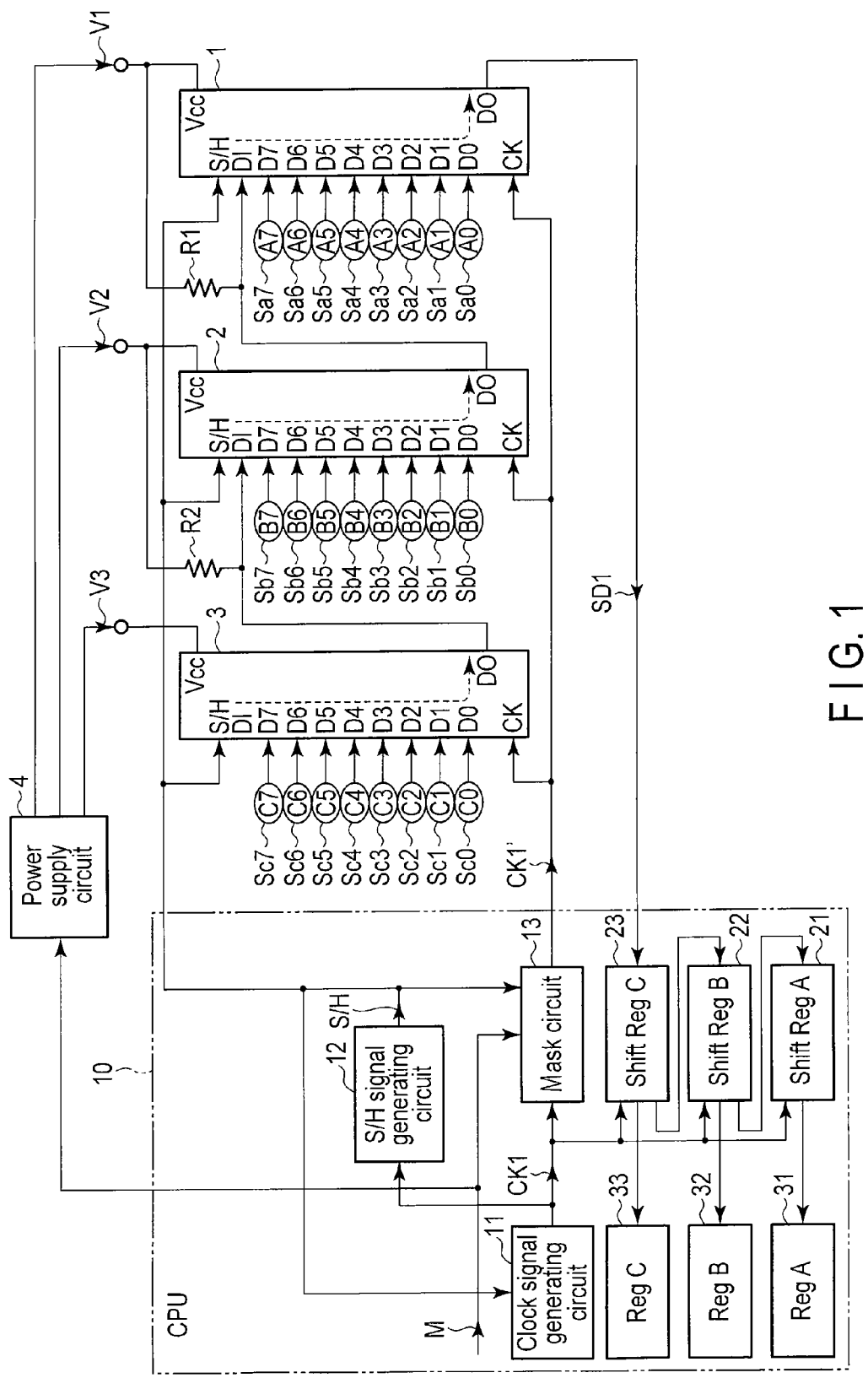
F I G. 1

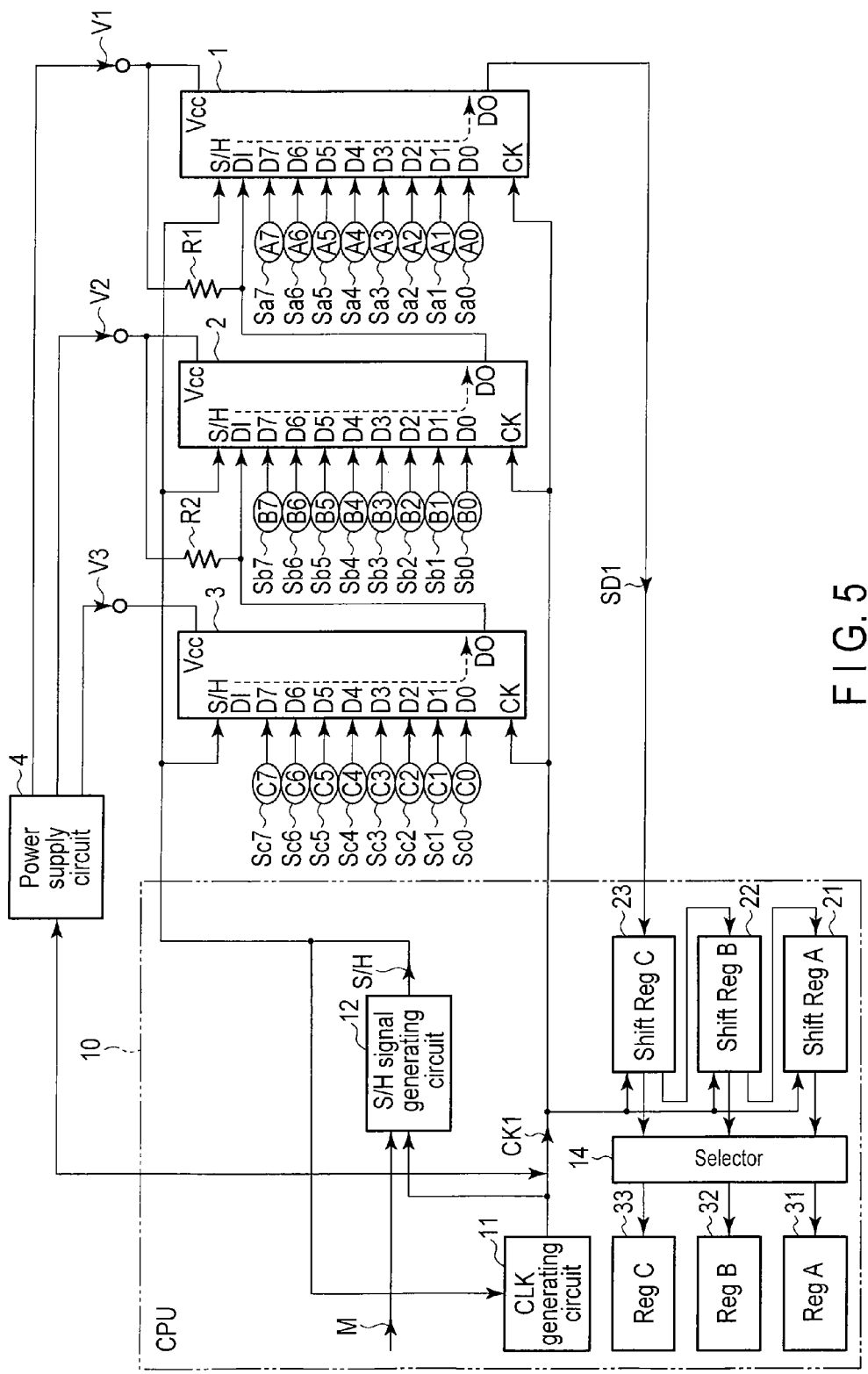
F I G. 5

ELECTRONIC APPARATUS AND CONTROL METHOD OF THE SAME

CROSS-REFERENCE TO RELATED APPLICATIONS

This application is based upon and claims the benefit of priority from U.S. Provisional Application No. 61/372,414, filed on Aug. 10, 2010, the entire contents of which are incorporated herein by reference.

FIELD

Embodiments described herein relate generally to an electronic apparatus which has a function of serially converting a plurality of digital signals, and a control method of the same.

BACKGROUND

In an electronic apparatus which includes a plurality of parallel/serial converting devices connected in cascade, and serially converts a plurality of digital signals output from a plurality of switches or sensors by the respective parallel/serial converting devices for reading, even when only some of the plurality of digital signals are desired to be read, all the parallel/serial converting devices are operated, and thus, all the digital signals are serially converted. Thus, electric power is wastefully consumed, and a reading cycle is lengthened.

BRIEF DESCRIPTION OF THE DRAWINGS

FIG. 1 is a block diagram illustrating a configuration of a first embodiment.

FIG. 5 is a block diagram illustrating a configuration of a second embodiment.

DETAILED DESCRIPTION

Figure 2:
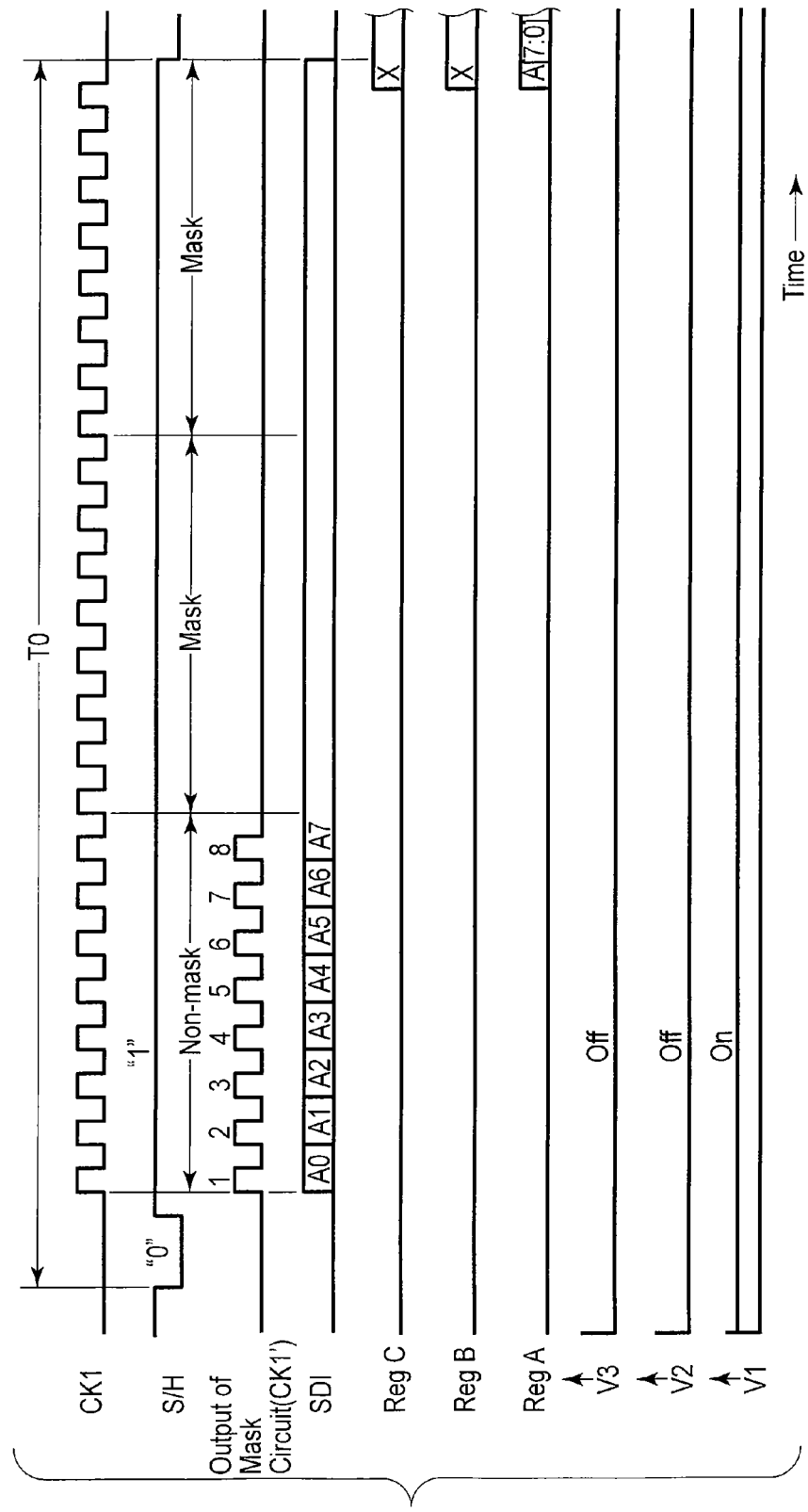
FIG. 2 is a time chart illustrating an operation in a standby mode according to the first embodiment.

In general, according to one embodiment, an electronic apparatus includes: a clock signal generating circuit which generates a clock signal; a shift/hold signal generating circuit which generates a shift/hold signal of a predetermined cycle; a second parallel/serial converting device which includes a second clock input terminal through which the clock signal generated in the clock signal generating circuit is input and a plurality of second parallel input terminals through which a plurality of second digital signals is input in parallel, which operates by a second operation voltage which is input, which retains the respective second digital signals input through the second parallel input terminals according to the shift/hold signal, and which sequentially shift-outputs the retained respective second digital signals in synchronization with the clock signal input through the second clock input terminal; a first parallel/serial converting device which includes a first clock input terminal through which the clock signal generated in the clock signal generating circuit is input, a plurality of first parallel input terminals through which a plurality of first digital signals is input in parallel, and a first serial input terminal through which the signals output from the second parallel/serial converting device are input, which operates by a first operation voltage which is input, which retains the respective first digital signals input through the first parallel input terminals according to the shift/hold signal, which sequentially shift-outputs the retained respective first digital signals in synchronization with the clock signal input through the first clock input terminal, and which sequentially shift-outputs the respective digital signals input through the first serial input terminal in synchronization with the clock signal input through the first clock input terminal, subsequent to the shift output of the respective first digital signals; a mask circuit which non-masks a clock signal portion used for shift-outputting the respective first digital signals by the first parallel/serial converting device and masks the remaining clock signal portion, in the clock signal supplied to the first and second parallel/serial converting devices from the clock signal generating circuit, when the apparatus is in a first mode, and non-masks the entire clock signal supplied to the first and second parallel/serial converting devices from the clock signal generating circuit, when the apparatus is in a second mode; and a power supply circuit which outputs the first operation voltage and does not output the second operation voltage in the first mode, and outputs the first and second operation voltages in the second mode.

[1] Hereinafter, a first embodiment will be described.

As shown in FIG. 1, an electronic apparatus includes a first parallel/serial converting device 1, a second parallel/serial converting device 2 and a third parallel/serial converting device 3 which are connected in cascade, and a CPU 10. The CPU 10 includes a clock signal generating circuit 11, a shift/hold signal generating circuit 12, a mask circuit 13, a first shift register 21, a second shift register 22, a third shift register 23, a first register 31, a second register 32, and a third register 33.

The clock signal generating circuit 11 generates a clock signal CK1. The shift/hold signal generating circuit 12 generates a shift/hold signal S/H which is changed in level at a predetermined cycle T0 based on the generated clock signal CK1. The mask circuit 13 performs a non-mask and mask process for the generated clock signal CK1. The predetermined cycle T0 includes a period of the clock signal CK1 of 24 pulses.

The third parallel/serial converting device 3 includes a third clock input terminal (CK) to which the clock signal CK1' supplied from the mask circuit 13 is input, a plurality of third parallel input terminals (D0, D1, . . . D7) to which a plurality of third digital signals C0, C1, . . . C7 is input in parallel, a third serial input terminal (DI), a third shift/hold input terminal (S/H) to which the shift/hold signal S/H is input, a third power supply terminal (Vcc) to which a third operation voltage V3 is input, and an output terminal (DO). When the shift/hold signal S/H input to the third shift/hold input terminal drops, the third parallel/serial converting device 3 retains the third digital signals C0, C1, . . . C7 input to the respective third parallel input terminals, and then sequentially shift-outputs the retained third digital signals C0, C1, . . . C7 in synchronization with the clock signal CK1 input to the third clock input terminal.

The third digital signals C0, C1, . . . C7 are outputs of switches Sc0, Sc1, . . . Sc3 and sensors Sc4, Sc5, . . . Sc7 which are used for checking a state of the electronic apparatus when a power supply is turned on and a state of the apparatus when the apparatus is returned from an error state. If the electronic apparatus is a digital copier, the switch Sc0 is turned on or turned off according to an installation state of a staple unit or a saddle unit which is an optional element, for example. The sensor Sc4 detects whether consumables are old or new. The sensor Sc5 detects the size of a sheet.

The second parallel/serial converting device 2 includes a second clock input terminal (CK) to which the clock signal CK1 is input, a plurality of second parallel input terminals (D0, D1, . . . D7) to which a plurality of second digital signals B0, B1, . . . B7 is input in parallel, a second serial input terminal (DI) to which the output of the third parallel/serial converting device 3 is input, a second shift/hold input terminal (S/H) to which the shift/hold signal S/H is input, a second power supply terminal (Vcc) to which a second operation voltage V2 is input, and an output terminal (DO). When the shift/hold signal S/H input to the second shift/hold input terminal drops, the second parallel/serial converting device 2 retain the second digital signals B0, B1, . . . B7 input to the respective second parallel input terminals, and then sequentially shift-outputs the retained second digital signals B0, B1, . . . B7 in synchronization with the clock signal CK1 input to the second clock input terminal and also sequentially shift-outputs the third digital signals C0, C1, . . . C7 input to the second serial input terminal in synchronization with the clock signal CK1 input to the second clock input terminal, subsequent to the shift output of the second digital signals B0, B1, . . . B7.

The second digital signals B0, B1, . . . B7 are outputs of switches Sb0, Sb1 and sensors Sb2, Sb3, . . . Sb7 which detect a variety of states of the electronic apparatus during operation. If the electronic apparatus is a digital copier, the sensors Sb2, Sb3, . . . Sb7 detect the existence of a paper sheet on a conveyance way, for example.

The first parallel/serial converting device 1 includes a first clock input terminal (CK) to which the clock signal CK1 is input, a plurality of first parallel input terminals (D0, D1, . . . D7) to which a plurality of first digital signals A0, A1, . . . A7 is input in parallel, a first serial input terminal (DI) to which the output of the second parallel/serial converting device 2 is input, a first shift/hold input terminal (S/H) to which the shift/hold signal S/H is input, a first power supply terminal (Vcc) to which a first operation voltage V1 is input, and an output terminal (DO). When the shift/hold signal S/H input to the first shift/hold input terminal drops, the first parallel/serial converting device 1 retains the first digital signals A0, A1, . . . A7 input to the respective first parallel input terminals, and then sequentially shift-outputs the retained first digital signals A0, A1, . . . A7 in synchronization with the clock signal CK1 input to the first clock input terminal and also sequentially shift-outputs the second digital signals B0, B1, . . . B7 and the third digital signals C0, C1, . . . C7 input to the first serial input terminal in synchronization with the clock signal CK1 input to the first clock input terminal, subsequent to the shift output of the first digital signals A0, A1, . . . A7. The shift output is supplied to the shift register 23 as a serial signal SDI.

The first digital signals A0, A1, . . . A7 are outputs of the switches Sa0, Sa1, . . . Sa7 of which states are changed by user operation of the electronic apparatus. If the electronic apparatus is a digital copier, some switches Sa0, Sa1, and so on detect opening and closing of a variety of covers, for example.

The mask circuit 13 receives a mode signal M and the shift/hold signal S/H. The mode signal M is a 2-bit digital signal. When the electronic apparatus is in a first mode, for example, a standby mode, the mode signal M is [0, 0], when the electronic apparatus is in a second mode, for example, a normal mode, the mode signal M is [0, 1], and when the electronic apparatus is in a third mode, for example, an initialization mode, the mode signal M is [1, 0].

The standby mode includes a so-called ready mode, a sleep mode, a pre-heating mode, or the like. In the standby mode, the CPU 10 uses the first digital signals A0, A1, . . . A7 for control, and does not use the second digital signals B0, B1, . . . B7 and the third digital signals C0, C1, . . . C7 for control. In the normal mode, the CPU 10 uses the first digital signals A0, A1, . . . A7 and the second digital signals B0, B1, B7 for control, and does not use the third digital signals C0, C1, . . . C7 for control. In the initialization mode, the CPU 10 uses all of the first digital signals A0, A1, . . . A7, the second digital signals B0, B1, . . . B7, and the third digital signals C0, C1, . . . C7 for control.

The operation voltage V2 is applied to the second serial input terminal of the second parallel/serial converting device 2 through a pull amplifier resistor R2. The operation voltage V1 is applied to the first serial input terminal of the first parallel/serial converting device 1 through a pull amplifier resistor R1.

At the predetermined cycle T0 to the next drop from the drop of the shift/hold signal S/H in the standby mode, the mask circuit 13 non-masks a clock signal portion of 8 pluses used for the shift output of the first digital signals A0, A1, . . . A7 by the first parallel/serial converting device 1 to be passed, in the clock signal CK1 from the clock signal generating circuit 11, and masks the remaining clock signal portion to be blocked. At the predetermined cycle T0 to the next drop from the drop of the shift/hold signal S/H in the normal mode, the mask circuit 13 non-masks a clock signal portion of 16 pulses used for the shift output of the first digital signals A0, A1, . . . A7 and the second digital signals B0, B1, . . . B7 by the first and second parallel/serial converting devices 1 and 2 to be passed, in the clock signal CK1 from the clock signal generating circuit 11, and masks the remaining clock signal portion to be blocked. At the predetermined cycle T0 to the next drop from the drop of the shift/hold signal S/H in the initialization mode, the mask circuit 13 non-masks a clock signal portion of 24 pulses used for the shift output of the first digital signals A0, A1, . . . A7, the second digital signals B0, B1, . . . B7 and the third digital signals C0, C1, . . . C7 by the first, second and third parallel/serial converting devices 1, 2 and 3 to be passed, in the clock signal CK1 from the clock signal generating circuit 11.

The third shift register 23 has a third capacity (=8 bits) corresponding to the number "8" of the third digital signals C0, C1, . . . C7, receives the serial signal SDI supplied from the first parallel/serial converting device 1, that is, the first digital signals A0, A1, . . . A7, the second digital signals B0, B1, B7, and the third digital signals C0, C1, . . . C7 as an input, temporarily stores the respective received digital signals while sequentially shifting the respective received digital signals in synchronization with the clock signal CK1 generated by the clock signal generating circuit 11, and shift-outputs signals exceeding the third capacity among the respective input digital signals in an inputted-sequential order.

The second shift register 22 has a second capacity (=8 bits) corresponding to the number "8" of the second digital signals B0, B1, . . . B7, receives the first digital signals A0, A1, . . . A7 and the second digital signals B0, B1, . . . B7 which are shift-output from the third shift register 23 as an input, temporarily stores the respective received digital signals while sequentially shifting the respective received digital signals in synchronization with the clock signal CK1 generated by the clock signal generating circuit 11, and shift-outputs signals exceeding the second capacity among the respective input digital signals in an inputted-sequential order.

The first shift register 21 has a first capacity (=8 bits) corresponding to the number "8" of the first digital signals A0, A1, ... A7, receives the first digital signals A0, A1, ... A7 which are shift-output from the second shift register 22 as an input, and temporarily stores the respective received digital signals while sequentially shifting the received first digital signals in synchronization with the clock signal CK1 generated by the clock signal generating circuit 11.

The third register 33 retains the third digital signals C0, C1, ... C7 which are temporarily stored in the third shift register 23. The second register 32 retains the second digital signals B0, B1, ... B7 which are temporarily stored in the second shift register 22. The first register 31 retains the first digital signals A0, A1, ... A7 which are temporarily stored in the first shift register 21.

The first operation voltage V1, the second operation voltage V2, and the third operation voltage V3 are outputs of the power supply circuit 4. The power supply circuit 4 outputs the first operation voltage V1, and does not output the second operation voltage V2 and the third operation voltage V3, in the standby mode based on the mode signal M. The power supply circuit 4 outputs the first operation voltage V1 and the second operation voltage V2, and does not output the third operation voltage V3, in the normal mode based on the mode signal M. The power supply circuit 4 outputs the first operation voltage V1, the second operation voltage V2, and the third operation voltage V3, in the initialization mode based on the mode signal M.

Next, the operation will be described.

As shown in FIG. 2, in the standby mode, at the predetermined cycle T0 based on the shift/hold signal S/H, the mask circuit 13 outputs the 8-pulse clock signal CK1. The first parallel/serial converting device 1 operates by the first operation voltage V1 supplied from the power supply circuit 4. The second and third parallel/serial converting devices 2 and 3 do not operate since there is no power supply of the second and third operation voltages V2 and V3 from the power supply circuit 4. The first, second and third shift registers 21, 22 and 23 perform the shift operation according to the clock signal CK1 supplied from the clock signal generating circuit 11.

The first parallel/serial converting device 1 sequentially shift-outputs the first digital signals A0, A1, ... A7 in synchronization with the 8-pulse clock signal CK1'. The first digital signals A0, A1, ... A7 which are shift-output from the first parallel/serial converting device 1 are input to the third shift register 23 by the shift operation of the third shift register 23. The first digital signals A0, A1, ... A7 passed through the third shift register 23 are input to the second shift register 22 by the shift operation of the second shift register 22. The first digital signals A0, A1, ... A7 passed through the second shift register 22 are stored in the first shift register 21 by the shift operation of the first shift register 21. Thereafter, the CPU 10 reads the first digital signals A0, A1, ... A7 in the first shift register 21 and then writes the result in the first register 31. Further, the CPU 10 performs a control according to the first digital signals A0, A1, ... A7 in the first register 31.

Since the second and third parallel/serial converting devices 2 and 3 do not operate in the standby mode, it is possible to reduce power consumption.

Figure 3:
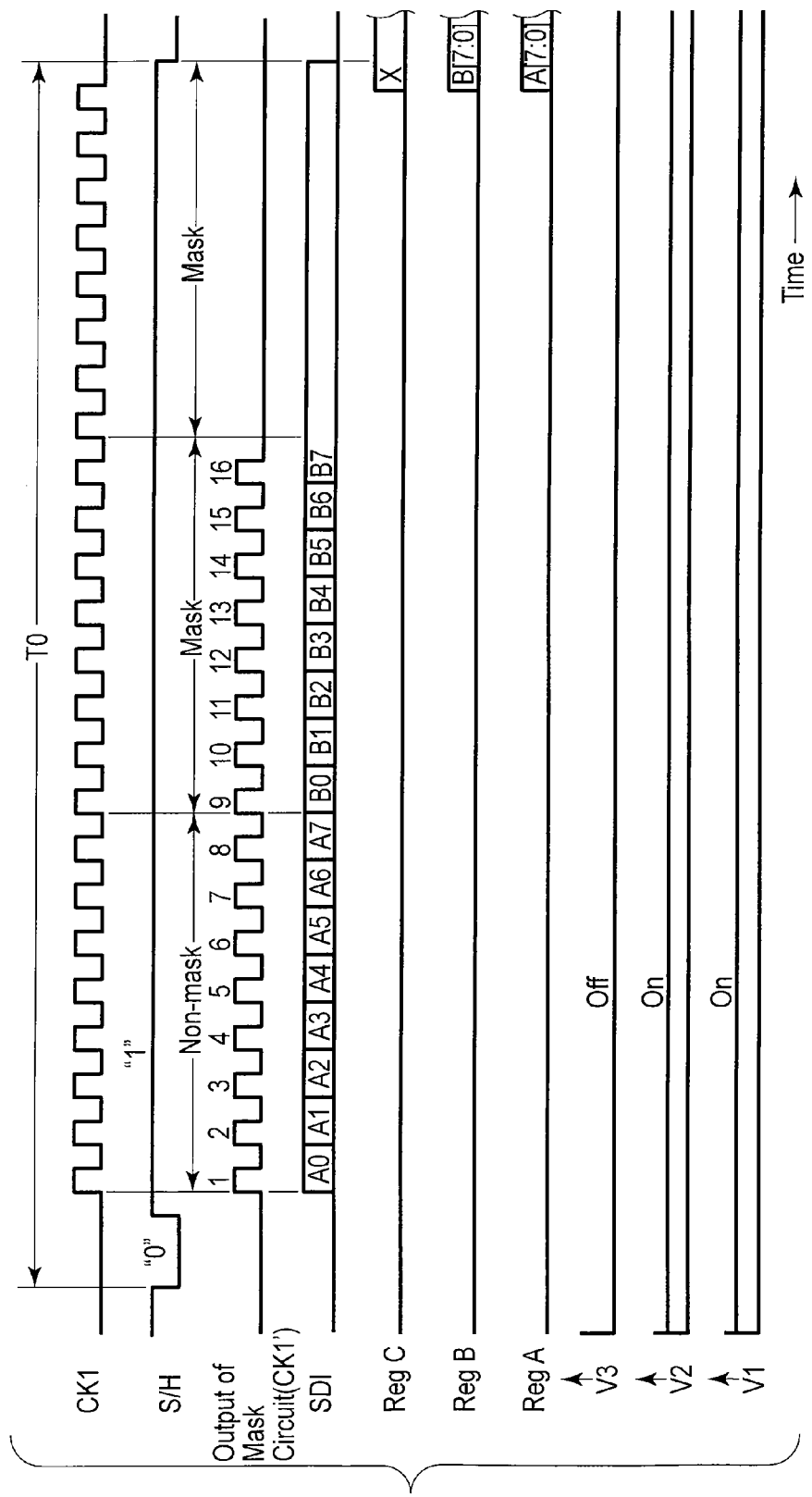
FIG. 3 is a time chart illustrating an operation in a normal mode according to the first embodiment.

In the normal mode, as shown in FIG. 3, at the predetermined cycle T0 based on the shift/hold signal S/H, the mask circuit 13 outputs the clock signal CK1' of 16 pulses. The first and second parallel/serial converting devices 1 and 2 operate by the first and second operation voltages V1 and V2 supplied from the power supply circuit 4. The third parallel/serial converting device 3 does not operate since there is no power supply of the third operation voltage V3 from the power supply circuit 4. The first, second and third shift registers 21, 22 and 23 perform the shift operation according to the clock signal CK1 supplied from the clock signal generating circuit 11.

The second parallel/serial converting device 2 sequentially shift-outputs the second digital signals B0, B1, ... B7 in synchronization with the clock signal CK1' of the first 8 pulses. The first parallel/serial converting device 1 sequentially shift-outputs the first digital signals A0, A1, ... A7 in synchronization with the clock signal CK1' of the first 8 pulses, and sequentially shift-outputs the second digital signals B0, B1, ... B7 supplied from the second parallel/serial converting device 2 in synchronization with the clock signal CK1' of the remaining 8 pulses.

The first digital signals A0, A1, ... A7 and the second digital signals B0, B1, ... B7 which are shift-output from the first parallel/serial converting device 1 are input to the third shift register 23 by the shift operation of the third shift register 23. The first digital signals A0, A1, ... A7 passed through the third shift register 23 are input to the second shift register 22 by the shift operation of the second shift register 22. The second digital signals B0, B1, ... B7 passed through the third shift register 23 are stored in the second shift register 22 by the shift operation of the second shift register 22. The first digital signals A0, A1, ... A7 passed through the second shift register 22 are stored in the first shift register 21. Thereafter, the CPU 10 reads the first digital signals A0, A1, ... A7 in the first shift register 21 and then writes the result in the first register 31. Further, the CPU 10 reads the second digital signals B0, B1, ... B7 in the second shift register 22 and then writes the result in the second register 32. Further, the CPU 10 performs a control according to the first digital signals A0, A1, ... A7 and the second digital signals B0, B1, ... B7 in the first and second registers 31 and 32.

In the normal mode, since the third parallel/serial converting device 3 does not operate, it is possible to reduce power consumption.

Figure 4:
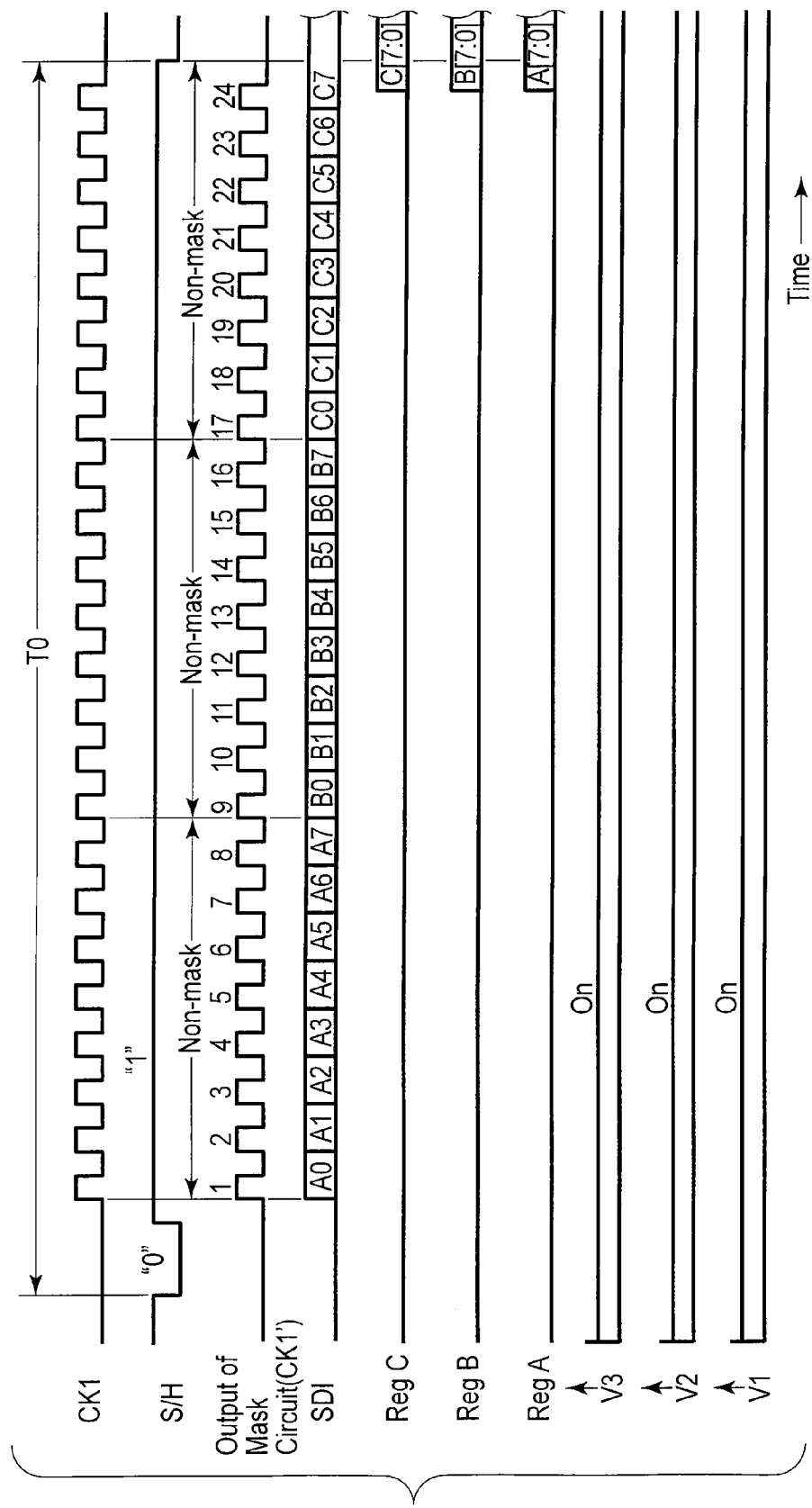
FIG. 4 is a time chart illustrating an operation in an initialization mode according to the first embodiment.

In the initialization mode, as shown in FIG. 4, at the predetermined cycle T0 based on the shift/hold signal S/H, the mask circuit 13 outputs the clock signal CK1' of 24 pulses. The first, second and third parallel/serial converting devices 1, 2 and 3 operate by the first, second and third operation voltages V1, V2 and V3 supplied from the power supply circuit 4. The first, second and third shift registers 21, 22 and 23 perform the shift operation according to the clock signal CK1 supplied from the clock signal generating circuit 11.

The third parallel/serial converting device 3 sequentially shift-outputs the third digital signals C0, C1, ... C7 in synchronization with the clock signal CK1' of the first 8 pulses. The second parallel/serial converting device 2 sequentially shift-outputs the second digital signals B0, B1, ... B7 in synchronization with the clock signal CK1' of the first 8 pulses, and sequentially shift-outputs the third digital signals C0, C1, ... C7 supplied from the third parallel/serial converting device 3 in synchronization with the clock signal CK1' of the next 8 pulses. The first parallel/serial converting device 1 sequentially shift-outputs the first digital signals A0, A1, ... A7 in synchronization with the clock signal CK1' of the first 8 pulses, and sequentially shift-outputs the second digital signals B0, B1, ... B7 and the third digital signals C0, C1, ... C7 supplied from the second parallel/serial converting device 2 in synchronization with the clock signal CK1' of the remaining 16 pulses.

The first digital signals A0, A1, ... A7 and the second digital signals B0, B1, ... B7 which are shift-output from the first parallel/serial converting device 1 are input to the third shift register 23 by the shift operation of the third shift register 23. The third digital signals C0, C1, ... C7 which are shift-output from the first parallel/serial converting device 1 are stored in the third shift register 23 by the shift operation of the third shift register 23.

The first digital signals A0, A1, . . . A7 passed through the third shift register 23 are input to the second shift register 22 by the shift operation of the second shift register 22. The second digital signals B0, B1, . . . B7 passed through the third shift register 23 are stored in the second shift register 22 by the shift operation of the second shift register 22. The first digital signals A0, A1, . . . A7 passed through the second shift register 22 are stored in the first shift register 21 by the shift operation of the first shift register 21.

Thereafter, the CPU 10 reads the first digital signals A0, A1, . . . A7 in the first shift register 21 and then writes the result in the first register 31. Further, the CPU 10 reads the second digital signals B0, B1, . . . B7 in the second shift register 22 and then writes the result in the second register 32, and reads the third digital signals C0, C1, . . . C7 in the third shift register 23 and then writes the result in the third register 33. Further, the CPU 10 performs a control according to the first digital signals A0, A1, . . . A7, the second digital signals B0, B1, . . . B7, and the third digital signals C0, C1, . . . C7 in the first, second and third registers 31, 32 and 33.

[2] A second embodiment will be described with reference to FIG. 5. In FIG. 5, the same reference numerals are given to the same components as in FIG. 1, and its detailed description will be omitted.

The CPU 10 includes the clock signal generating circuit 11, the shift/hold signal generating circuit 12, a selector 14, the first shift register 21, the second shift register 22, the third shift register 23, the first register 31, the second register 32, and the third register 33.

The shift/hold signal generating circuit 12 generates a shift/hold signal S/H which is changed in level at a predetermined cycle T1 based on the clock signal CK1 in the standby mode, generates a shift/hold signal S/H which is changed in level at a predetermined cycle T2 (>T1) based on the clock signal CK1 in the normal mode, and generates a shift/hold signal S/H which is changed in level at a predetermined cycle T3 (>T2) based on the clock signal CK1 in the initialization mode.

The predetermined cycle T1 includes a period Ta necessary for shift-outputting the first digital signals A0, A1, . . . A7 by the first parallel/serial converting device 1.

The predetermined cycle T2 includes a period Ta necessary for shift-outputting the first digital signals A0, A1, . . . A7 by the first parallel/serial converting device 1 and for shift-outputting the second digital signals B0, B1, . . . B7 by the second parallel/serial converting device 2; and a period Tb necessary for shift-outputting the second digital signals B0, B1, . . . B7 by the first parallel/serial converting device 1.

The predetermined cycle T3 includes a period Ta necessary for shift-outputting the first digital signals A0, A1, . . . A7 by the first parallel/serial converting device 1, for shift-outputting second digital signals B0, B1, . . . B7 by the second parallel/serial converting device 2, and for shift-outputting the third digital signals C0, C1, . . . C7 by the third parallel/serial converting device 3; a period Tb necessary for shift-outputting the second digital signals B0, B1, . . . B7 by the first parallel/serial converting device 1 and for shift-outputting the third digital signals C0, C1, . . . C7 by the second parallel/serial converting device 2; and a period Tc necessary for shift-outputting the third digital signals C0, C1, . . . C7 by the first parallel/serial converting device 1.

When the digital signals of 8-bits are stored in the third shift register 23 in the standby mode, the selector 14 selects the digital signals of 8-bits in the third shift register 23 as the first digital signals A0, A1, . . . A7 and writes the result in the first register 31. When the digital signals of 8-bits are respectively stored in second and third shift registers 22 and 23 in the normal mode, the selector 14 selects the digital signals of 8-bits in the second shift register 22 as the first digital signals A0, A1, . . . A7 and writes the result in the first register 31, and also selects the digital signals of 8-bits in the third shift register 23 as the second digital signals B0, B1, . . . B7 and writes the result in the second register 32. Further, when the digital signals of 8-bits are respectively stored in the first, second and third shift registers 21, 22 and 23 in the initialization mode, the selector 14 selects the digital signals of 8-bits in the first shift register 21 as the first digital signals A0, A1, . . . A7 and writes the result in the first register 31, selects the digital signals of 8-bits in the second shift register 22 as the second digital signals B0, B1, . . . B7 and writes the result in the second register 32, and selects the digital signals of 8-bits in the third shift register 23 as the third digital signals C0, C1, . . . C7 and writes the result in the third register 33.

Next, the operation will be described.

Figure 6:
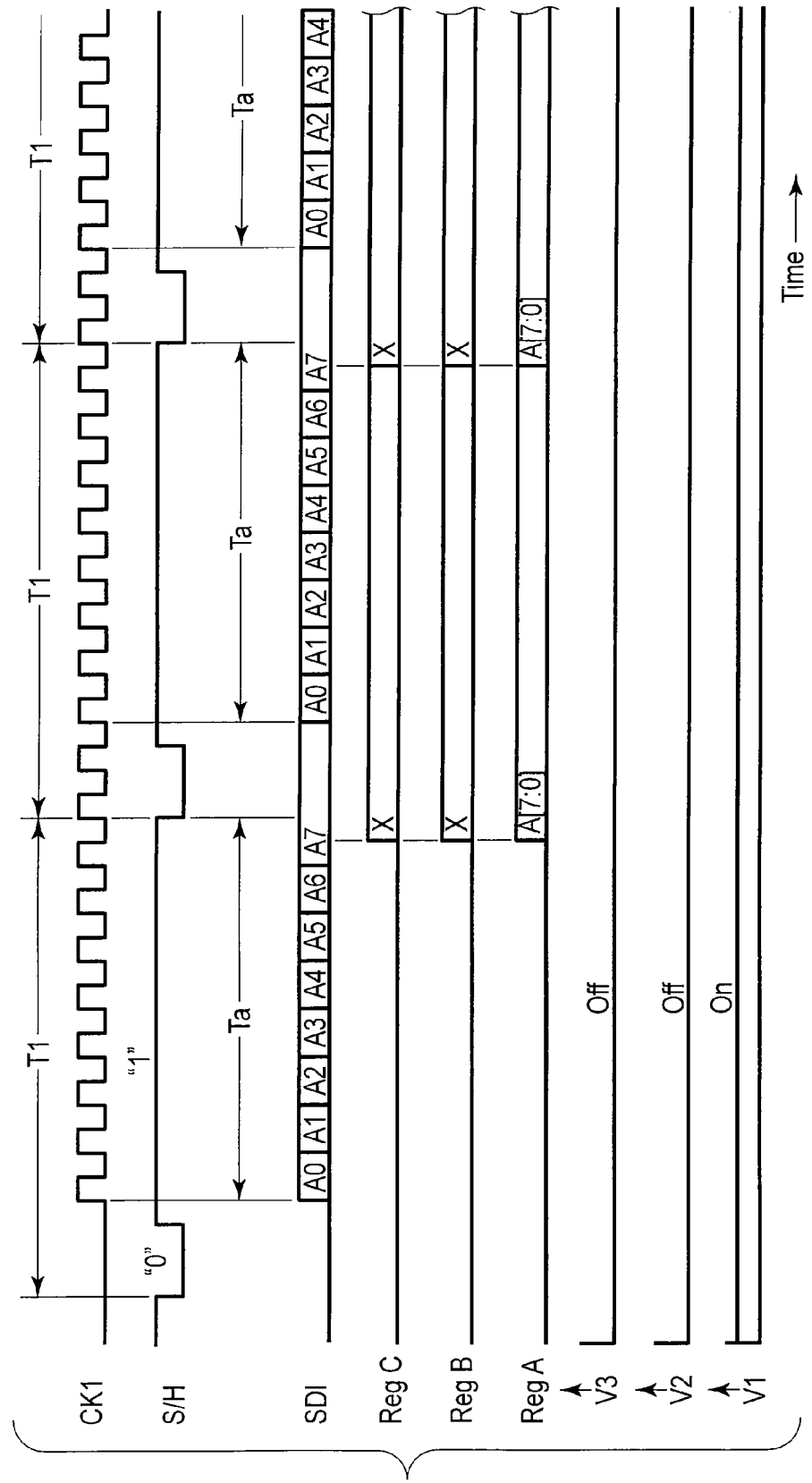
FIG. 6 is a time chart illustrating an operation in a standby mode according to the second embodiment.

As shown in FIG. 6, in the standby mode, the shift/hold signal S/H which is changed in level at the predetermined cycle T1 is output from the shift/hold signal generating circuit 12. The first parallel/serial converting device 1 operates by the first operation voltage V1 supplied from the power supply circuit 4. The second and third parallel/serial converting devices 2 and 3 do not operate since there is no power supply of the second and third operation voltages V2 and V3 from the power supply circuit 4. The first, second and third shift registers 21, 22 and 23 perform the shift operation according to the clock signal CK1 supplied from the clock signal generating circuit 11.

The first parallel/serial converting device 1 sequentially shift-outputs the first digital signals A0, A1, . . . A7 in synchronization with the 8-pulse clock signal CK1, at the period Ta in the predetermined cycle T1. The first digital signals A0, A1, . . . A7 which are shift-output from the first parallel/serial converting device 1 are stored in the third shift register 23 by the shift operation of the third shift register 23. Thereafter, the selector 14 selects the first digital signals A0, A1, . . . A7 in the third shift register 23 and writes the result in the first register 31. The CPU 10 performs a control according to the first digital signals A0, A1, . . . A7 in the first register 31.

In this way, the CPU 10 can read the first digital signals A0, A1, . . . A7 necessary for control at a short cycle of the predetermined cycle T1. Due to reduction in the reading cycle, the control response of the CPU 10 becomes efficient. Further, since the second and third parallel/serial converting devices 2 and 3 do not operate, it is possible to reduce power consumption.

Figure 7:
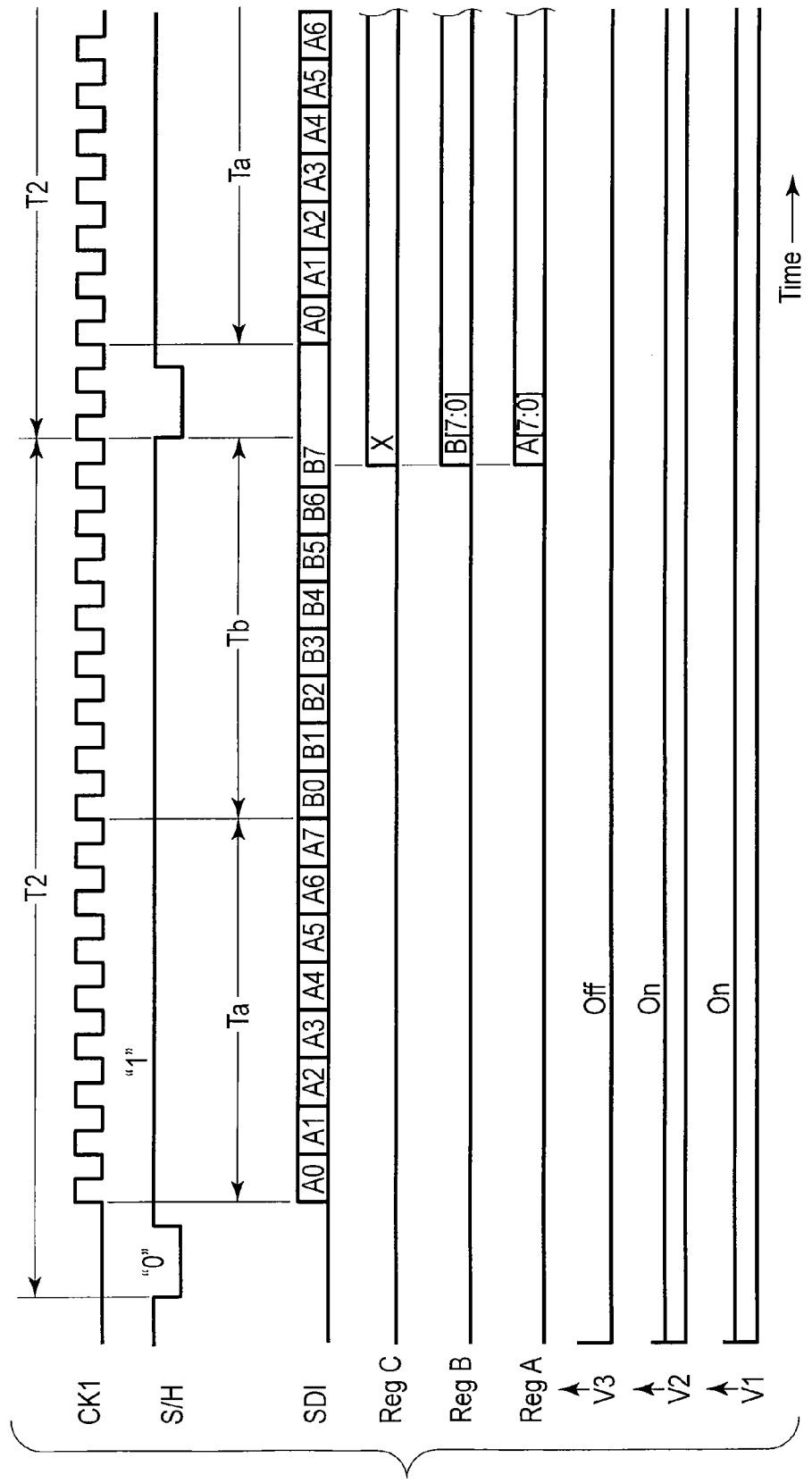
FIG. 7 is a time chart illustrating an operation in a normal mode according to the second embodiment.

In the normal mode, as shown in FIG. 7, the shift/hold signal S/H which is changed in level at the predetermined cycle T2 is output from the shift/hold signal generating circuit 12. The first and second parallel/serial converting devices 1 and 2 operate by the first and second operation voltages V1 and V2 supplied from the power supply circuit 4. The third parallel/serial converting device 3 does not operate since there is no power supply of the third operation voltages V3 from the power supply circuit 4. The first, second and third shift registers 21, 22 and 23 perform the shift operation according to the clock signal CK1 supplied from the clock signal generating circuit 11.

The first parallel/serial converting device 1 sequentially shift-outputs the first digital signals A0, A1, . . . A7 in synchronization with the 8-pulse clock signal CK1, at the period Ta in the predetermined cycle T2. At the same period Ta, the second parallel/serial converting device 2 sequentially shift-outputs the second digital signals B0, B1, . . . B7 in synchronization with the 8-pulse clock signal CK1. Further, at the period Tb in the predetermined cycle T2, the first parallel/serial converting device 1 sequentially shift-outputs the second digital signals B0, B1, . . . B7 which are shift-output from the second parallel/serial converting device 2 in synchronization with the 8-pulse clock signal CK1.

The first digital signals A0, A1, . . . A7 which are shift-output from the first parallel/serial converting device 1 are input to the third shift register 23 by the shift operation of the third shift register 23. The first digital signals A0, A1, . . . A7 passed through the third shift register 23 are stored in the second shift register 22 by the shift operation of the second shift register 22. The second digital signals B0, B1, . . . B7 which are shift-output from the first parallel/serial converting device 1 are stored in the third shift register 23 by the shift operation of the third shift register 23.

Thereafter, the selector 14 selects the first digital signals A0, A1, . . . A7 in the second shift register 22 and then writes the result in the first register 31. The selector 14 selects the second digital signals B0, B1, . . . B7 in the third shift register 23 and then writes the result in the second register 32.

Further, the CPU 10 performs a control according to the first digital signals A0, A1, . . . A7 and the second digital signals B0, B1, . . . B7 in the first and second registers 31 and 32.

In this way, the CPU 10 can read the first digital signals A0, A1, . . . A7 and the second digital signals B0, B1, . . . B7 which are necessary for control at a short cycle of the predetermined cycle T2. Due to reduction in the reading cycle, the control response of the CPU 10 becomes efficient. Further, since the third parallel/serial converting device 3 does not operate, it is possible to reduce power consumption.

Figure 8:
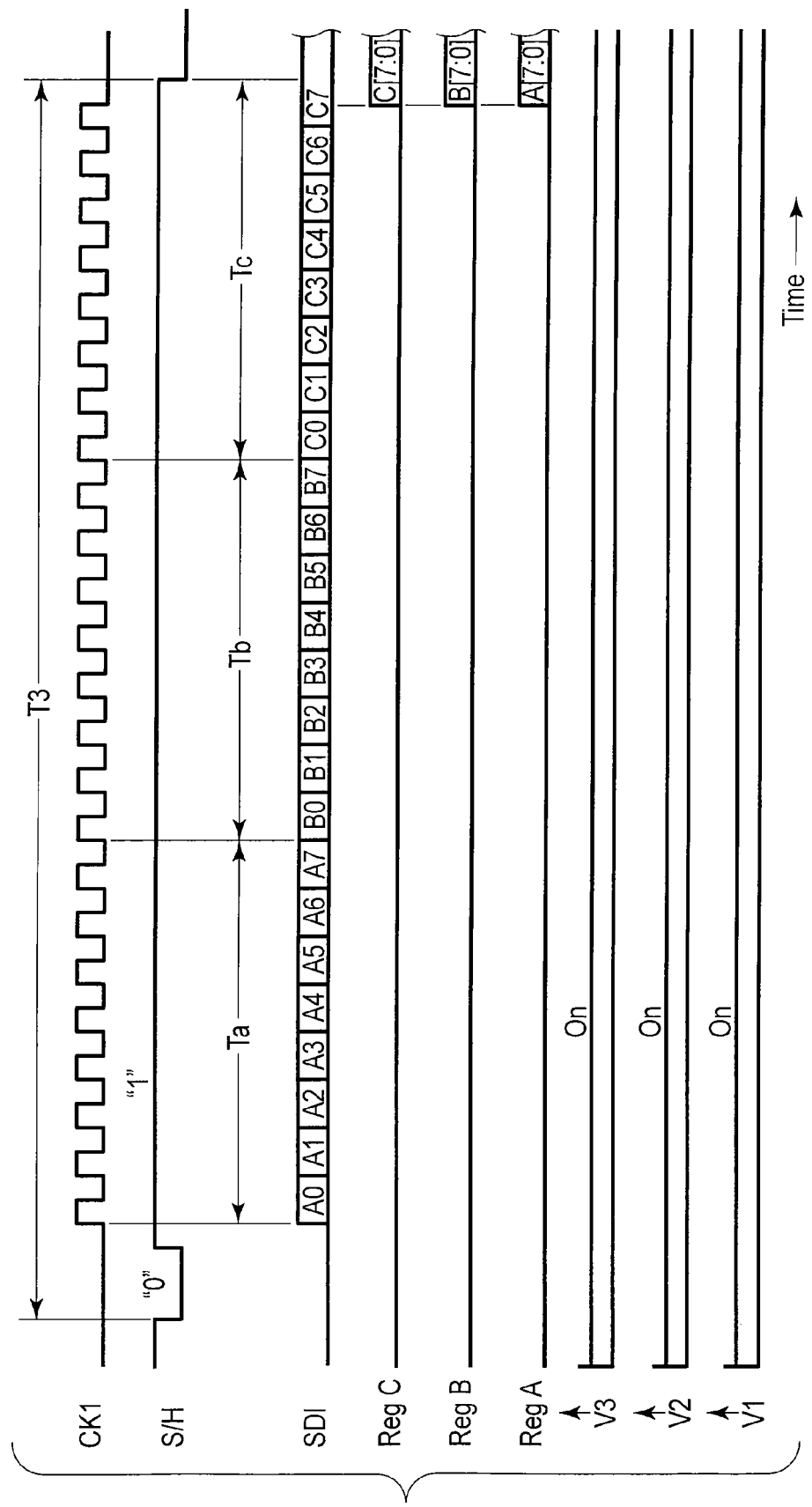
FIG. 8 is a time chart illustrating an operation in an initialization mode according to the second embodiment.

In the initialization mode, as shown in FIG. 8, the shift/hold signal S/H which is changed in level at the predetermined cycle T3 is output from the shift/hold signal generating circuit 12. The first, second and third parallel/serial converting devices 1, 2 and 3 operate by the first, second and third operation voltages V1, V2 and V3 supplied from the power supply circuit 4. The first, second and third shift registers 21, 22 and 23 perform the shift operation according to the clock signal CK1 supplied from the clock signal generating circuit 11.

The first parallel/serial converting device 1 sequentially shift-outputs the first digital signals A0, A1, . . . A7 in synchronization with the 8-pulse clock signal CK1, at the period Ta in the predetermined cycle T3. At the same period Ta, the second parallel/serial converting device 2 sequentially shift-outputs the second digital signals B0, B1, . . . B7 in synchronization with the 8-pulse clock signal CK1. Further, at the same period Ta, the third parallel/serial converting device 3 sequentially shift-outputs the third digital signals C0, C1, . . . C7 in synchronization with the 8-pulse clock signal CK1.

Further, the first parallel/serial converting device 1 sequentially shift-outputs the second digital signals B0, B1, . . . B7 which are shift-output from the second parallel/serial converting device 2 in synchronization with the 8-pulse clock signal CK1, at the period Tb in the predetermined cycle T3. At the same period Tb, the second parallel/serial converting device 2 sequentially shift-outputs the third digital signals C0, C1, . . . C7 which are shift-output from the third parallel/serial converting device 3 in synchronization with the 8-pulse clock signal CK1.

Further, at the period Tc in the predetermined cycle T3, the first parallel/serial converting device 1 sequentially shift-outputs the third digital signals C0, C1, . . . C7 which are shift-output from the second parallel/serial converting device 2.

The first digital signals A0, A1, . . . A7 which are shift-output from the first parallel/serial converting device 1 are input to the third shift register 23 by the shift operation of the third shift register 23. The first digital signals A0, A1, . . . A7 passed through the third shift register 23 are input to the second shift register 22 by the shift operation of the second shift register 22. The first digital signals A0, A1, . . . A7 passed through the second shift register 22 are stored in the first shift register 21 by the shift operation of the first shift register 21.

The second digital signals B0, B1, . . . B7 which are shift-output from the first parallel/serial converting device 1 are input to the third shift register 23 by the shift operation of the third shift register 23. The second digital signals B0, B1, . . . B7 passed through the third shift register 23 are stored in the second shift register 22 by the shift operation of the second shift register 22.

The third digital signals C0, C1, . . . C7 which are shift-output from the first parallel/serial converting device 1 are stored in the third shift register 23 by the shift operation of the third shift register 23.

Thereafter, the selector 14 selects the first digital signals A0, A1, . . . A7 in the first shift register 21 and then writes the result in the first register 31. The selector 14 selects the second digital signals B0, B1, . . . B7 in the second shift register 22 and then writes the result in the second register 32. The selector 14 selects the third digital signals C0, C1, . . . C7 in the third shift register 23 and then writes the result in the third register 33.

Further, the CPU 10 performs a control according to the first digital signals A0, A1, . . . A7, the second digital signals B0, B1, . . . B7, and the third digital signals C0, C1, . . . C7 in the first, second and third registers 31, 32, and 33.

According to the above-mentioned embodiments, although three parallel/serial converting devices are connected in cascade, two parallel/serial converting devices or four parallel/serial converting devices or more may be connected in cascade.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a clock signal generating circuit which generates a clock signal;
a shift/hold signal generating circuit which generates a shift/hold signal of a predetermined cycle;
a second parallel/serial converting device which includes a second clock input terminal through which the clock signal generated in the clock signal generating circuit is input and a plurality of second parallel input terminals through which a plurality of second digital signals is input in parallel, which operates by a second operation voltage which is input, which retains the respective second digital signals input through the second parallel input terminals according to the shift/hold signal, and which sequentially shift-outputs the retained respective second digital signals in synchronization with the clock signal input through the second clock input terminal;

a first parallel/serial converting device which includes a first clock input terminal through which the clock signal generated in the clock signal generating circuit is input, a plurality of first parallel input terminals through which a plurality of first digital signals is input in parallel, and a first serial input terminal through which the signals output from the second parallel/serial converting device are input, which operates by a first operation voltage which is input, which retains the respective first digital signals input through the first parallel input terminals according to the shift/hold signal, which sequentially shift-outputs the retained respective first digital signals in synchronization with the clock signal input through the first clock input terminal, and which sequentially shift-outputs the respective digital signals input through the first serial input terminal in synchronization with the clock signal input through the first clock input terminal, subsequent to the shift output of the respective first digital signals;

a mask circuit which non-masks a clock signal portion used for shift-outputting the respective first digital signals by the first parallel/serial converting device and masks the remaining clock signal portion, in the clock signal supplied to the first and second parallel/serial converting devices from the clock signal generating circuit, when the apparatus is in a first mode, and non-masks the entire clock signal supplied to the first and second parallel/serial converting devices from the clock signal generating circuit, when the apparatus is in a second mode; and a power supply circuit which outputs the first operation voltage and does not output the second operation voltage in the first mode, and outputs the first and second operation voltages in the second mode.

2. The apparatus of claim 1, wherein the first mode is a mode in which only the respective first digital signals among the respective first and second digital signals are used, and wherein the second mode is a mode in which the respective first and second digital signals are all used.

3. The apparatus of claim 2, wherein the respective first digital signals are output signals of a plurality of switches of which states are changed according to operation of a user, and are larger in usage frequency than the respective second digital signals, and wherein the respective second digital signals are output signals of a plurality of switches or sensors which detects a variety of states during operation of the apparatus.

4. The apparatus of claim 1, wherein the shift/hold signal generating circuit generates a shift/hold signal which is changed in level at a predetermined cycle, on the basis of the clock signal generated in the clock signal generating circuit.

5. The apparatus of claim 1, further comprising:

a third parallel/serial converting device which includes a third clock input terminal through which the clock signal generated in the clock signal generating circuit is input and a plurality of third parallel input terminals through which a plurality of third digital signals is input in parallel, which operates by a third operation voltage which is input, which retains the respective third digital signals input through the third parallel input terminals according to the shift/hold signal, and which sequentially shift-outputs the retained respective third digital signals in synchronization with the clock signal input through the third clock input terminal.

6. The apparatus of claim 5, wherein the second parallel/serial converting device includes the second clock input terminal, the respective parallel input terminals and a second serial input terminal through which the signals output from the third parallel/serial converting device are input; operates by the input second operation voltage; retains the respective second digital signals input through the second parallel input terminals according to the shift/hold signal; sequentially shift-outputs the retained respective second digital signals in synchronization with the clock signal input through the second clock input terminal; and sequentially shift-outputs the respective digital signals input through the second serial input terminal in synchronization with the clock signal input through the second clock input terminal, subsequent to the shift output of the respective second digital signals, wherein the mask circuit non-masks the clock signal portion used for shift-outputting the respective first digital signals by the first parallel/serial converting device and masks the remaining clock signal portion, in the clock signal supplied to the first, second and third parallel/serial converting devices from the clock signal generating circuit, in the first mode; non-masks a clock signal portion used for shift-outputting the respective first and second digital signals by the first and second parallel/serial converting devices and a clock signal portion used for shift-outputting the respective second digital signals by the first parallel/serial converting device and masks the remaining clock signal portion, in the clock signal supplied to the first, second and third parallel/serial converting devices from the clock signal generating circuit, in the second mode; and non-masks the entire clock signal supplied to the first, second and third parallel/serial converting devices from the clock signal generating circuit at the predetermined cycle based on the shift/hold signal, when the apparatus is in a third mode, and wherein the power supply circuit outputs the first operation voltage and does not output the second and third operation voltages in the first mode; outputs the first and second operation voltages and does not output the third operation voltage in the second mode; and outputs the first, second and third operation voltages in the third mode.

7. The apparatus of claim 6, wherein the first mode is a mode in which only the respective first digital signals among the respective first, second and third digital signals are used, wherein the second mode is a mode in which the respective first and second digital signals among the respective first, second and third digital signals are used, and wherein the third mode is a mode in which the respective first, second and third digital signals are all used.

8. The apparatus of claim 7, wherein the respective first digital signals are output signals of a plurality of switches of which states are changed according to operation of a user, and are larger in usage frequency than the respective second and third digital signals, wherein the respective second digital signals are output signals of a plurality of switches or sensors which detects a variety of states during operation of the apparatus, and are larger in usage frequency than the respective third digital signals, and wherein the respective third digital signals are output signals of a plurality of switches or sensors which is used to check a state of the apparatus when a power supply is turned on and output signals of a plurality of switches or sensors which is used to check a state of the apparatus when the apparatus is returned from an error state.

9. The apparatus of claim 6, further comprising:
a third shift register which has a third capacity corresponding to the number of the respective third digital signals, receives the respective digital signals shift-output from the first parallel/serial converting device as an input, temporarily stores the respective received digital signals while sequentially shifting the respective received digital signals in synchronization with the clock signal generated in the clock signal generating circuit, and shift-outputs signals exceeding the third capacity among the respective input digital signals in an inputted-sequential order;
a second shift register which has a second capacity corresponding to the number of the respective second digital signals, receives the respective digital signals shift-output from the third shift register as an input, temporarily stores the respective received digital signals while sequentially shifting the respective received digital signals in synchronization with the clock signal generated in the clock signal generating circuit, and shift-outputs signals exceeding the second capacity among the respective input digital signals in an inputted-sequential order; and
a first shift register which has a first capacity corresponding to the number of the respective first digital signals, receives the respective digital signals shift-output from the second shift register as an input, and temporarily stores the received first digital signals while sequentially shifting the received first digital signals in synchronization with the clock signal generated in the clock signal generating circuit.

10. The apparatus of claim 9, further comprising:
a third register which retains the respective third digital signals in the third shift register;
a second register which retains the respective second digital signals in the second shift register; and
a first register which retains the respective first digital signals in the first shift register.

11. An electronic apparatus comprising:
a clock signal generating circuit which generates a clock signal;
a shift/hold signal generating circuit which generates a shift/hold signal which is changed in level at a predetermined cycle T1, in a first mode, and generates a shift/hold signal which is changed in level at a predetermined cycle T2 (>T1), in a second mode;
a second parallel/serial converting device which includes a second clock input terminal through which the clock signal generated in the clock signal generating circuit is input, a plurality of second parallel input terminals through which a plurality of second digital signals is input in parallel, and a second serial input terminal through which the output from the respective third parallel/serial converting devices is input, which retains the respective second digital signals input through the second parallel input terminals according to the shift/hold signal, which sequentially shift-outputs the retained respective second digital signals in synchronization with the clock signal input through the second clock input terminal, and which sequentially shift-outputs the respective digital signals input through the second serial input terminal in synchronization with the clock signal input through the second clock input terminal, subsequent to the shift output of the respective second digital signals;
a first parallel/serial converting device which includes a first clock input terminal through which the clock signal generated in the clock signal generating circuit is input, a plurality of first parallel input terminals through which a plurality of first digital signals is input in parallel, and a first serial input terminal through which the signals output from the second parallel/serial converting device are input, which retains the respective first digital signals input through the first parallel input terminals according to the shift/hold signal, which sequentially shift-outputs the retained respective first digital signals in synchronization with the clock signal input through the first clock input terminal, and which sequentially shift-outputs the respective digital signals input through the first serial input terminal in synchronization with the clock signal input through the first clock input terminal, subsequent to the shift output of the respective first digital signals;
a second shift register which has a second capacity corresponding to the number of the respective second digital signals, receives the respective digital signals shift-output from the first parallel/serial converting device as an input, temporarily stores the respective received digital signals while sequentially shifting the respective received digital signals in synchronization with the clock signal generated in the clock signal generating circuit, and shift-outputs signals exceeding the second capacity among the respective input digital signals in an inputted-sequential order;
a first shift register which has a first capacity corresponding to the number of the respective first digital signals, receives the respective digital signals shift-output from the second shift register as an input, and temporarily stores the respective received first digital signals while sequentially shifting the respective received first digital signals in synchronization with the clock signal generated in the clock signal generating circuit;
a selector which selects the respective digital signals in the third shift register as the respective first digital signals, in the first mode, and selects the respective digital signals in the second and third shift registers as the respective first digital signals and the respective second digital signals, in the second mode; and
a power supply circuit which outputs a first operation voltage and does not output the second operation voltage in the first mode, and outputs the first and second operation voltages in the second mode.

12. The apparatus of claim 11, further comprising:
a third parallel/serial converting device which includes a third clock input terminal through which the clock signal generated in the clock signal generating circuit is input and a plurality of third parallel input terminals through which a plurality of third digital signals is input in parallel, which retains the respective third digital signals input through the third parallel input terminals according to the shift/hold signal, and which sequentially shift-outputs the retained respective third digital signals in synchronization with the clock signal input through the third clock input terminal; and
a third shift register which has a third capacity corresponding to the number of the respective third digital signals, receives the respective digital signals shift-output from the first parallel/serial converting device as an input, temporarily stores the respective received digital signals while sequentially shifting the respective received digital signals in synchronization with the clock signal generated in the clock signal generating circuit, and shift-outputs signals exceeding the third capacity among the respective input digital signals in an inputted-sequential order.

13. The apparatus of claim 12,
wherein the shift/hold signal generating circuit generates the shift/hold signal which is changed in level at the predetermined cycle T1 in the first mode, generates the shift/hold signal which is changed in level at the predetermined cycle T2 (>T1) in the second mode, and generates a shift/hold signal which is changed in level at a predetermined cycle T3 (>T2) when the apparatus is in a third mode,
wherein the second shift register has the second capacity corresponding to the number of the respective second digital signals, receives the respective digital signals shift-output from the third shift register as an input, temporarily stores the respective received digital signals while sequentially shifting the respective received digital signals in synchronization with the clock signal generated in the clock signal generating circuit, and shift-outputs signals exceeding the second capacity among the respective input digital signals in an inputted-sequential order,
wherein the selector selects the respective digital signals in the third shift register as the respective first digital signals in the first mode, selects the respective digital signals in the second and third shift registers as the respective first digital signals and the respective second digital signals in the second mode, and selects the respective digital signals in the first, second and third shift registers as the respective first, second and third digital signals in the third mode, and
wherein the power supply circuit outputs the first operation voltage and does not output the second operation voltage and a third operation voltage in the first mode, outputs the first and second operation voltages and does not output the third operation voltage in the second mode, and outputs the first, second and third operation voltages in the third mode.

14. The apparatus of claim 13,
wherein the first mode is a mode in which the respective first digital signals are used, and the respective second and third digital signals are not used,
wherein the second mode is a mode in which the respective first and second digital signals are used, and the respective third digital signals are not used, and
wherein the third mode is a mode in which the respective first, second and third digital signals are all used.

15. The apparatus of claim 13,
wherein the shift/hold signal generating circuit generates the shift/hold signal which is changed in level at the predetermined cycle T1 based on the clock signal generated in the clock signal generating circuit in the first mode, generates the shift/hold signal which is changed in level at the predetermined cycle T2 (>T1) based on the clock signal generated in the clock signal generating circuit in the second mode, and generates the shift/hold signal which is changed in level at the predetermined cycle T3 (>T2) based on the clock signal generated in the clock signal generating circuit in the third mode.

16. The apparatus of claim 13,
wherein the predetermined cycle T1 includes a period Ta used for shift-outputting the respective first digital signals by the first parallel/serial converting device, wherein the predetermined cycle T2 includes the period Ta used for shift-outputting the respective first digital signals by the first parallel/serial converting device and the respective second digital signals by the second parallel/serial converting device, and a period Tb used for shift-outputting the respective second digital signals by the first parallel/serial converting device, and
wherein the predetermined cycle T3 includes the period Ta used for shift-outputting the respective first digital signals by the first parallel/serial converting device, the respective second digital signals by the second parallel/serial converting device, and the respective third digital signals by the third parallel/serial converting device, the period Tb used for shift-outputting the respective second digital signals by the first parallel/serial converting device and the respective third digital signals by the second parallel/serial converting device, and a period Tc used for shift-outputting the respective third digital signals by the first parallel/serial converting device.

17. The apparatus of claim 13,
wherein the respective first digital signals are output signals of a plurality of switches of which states are changed according to operation of a user,
wherein the respective second digital signals are output signals of a plurality of switches or sensors which detects a variety of states during operation of the apparatus, and
wherein the respective third digital signals are output signals of a plurality of switches or sensors which is used to check a state of the apparatus when a power supply is turned on and output signals of a plurality of switches or sensors, which is used to check a state of the apparatus when the apparatus is returned from an error state.

18. The apparatus of claim 13,
wherein the shift/hold signal generating circuit generates the shift/hold signal of the predetermined cycle T1 based on the clock signal generated in the clock signal generating circuit in the first mode, generates the shift/hold signal of the predetermined cycle T2 (>T1) based on the clock signal generated in the clock signal generating circuit in the second mode, and generates the shift/hold signal of the predetermined cycle T3 (>T2) based on the clock signal generated in the clock signal generating circuit in the third mode.

19. The apparatus of claim 13, further comprising:
a first register which retains the respective first digital signals selected by the selector;
a second register which retains the respective second digital signals selected by the selector; and
a third register which retains the respective third digital signals selected by the selector.

20. A control method of an electronic apparatus including a clock signal generating circuit which generates a clock signal; a shift/hold signal generating circuit which generates a shift/hold signal of a predetermined cycle; a second parallel/serial converting device which includes a second clock input terminal through which the clock signal generated in the clock signal generating circuit is input and a plurality of second parallel input terminals through which a plurality of second digital signals is input in parallel, which operates by a second operation voltage which is input, which retains the respective second digital signals input through the second parallel input terminals according to the shift/hold signal, and which sequentially shift-outputs the retained respective second digital signals in synchronization with the clock signal input through the second clock input terminal; and a first parallel/serial converting device which includes a first clock input terminal through which the clock signal generated in the clock signal generating circuit is input, a plurality of first parallel input terminals through which a plurality of first digital signals is input in parallel, and a first serial input terminal through which the signals output from the second parallel/serial converting device are input, which operates by a first operation voltage which is input, which retains the respective first digital signals input through the first parallel input terminals according to the shift/hold signal, which sequentially shift-outputs the retained respective first digital signals in synchronization with the clock signal input through the first clock input terminal, and which sequentially shift-outputs the respective digital signals input through the first serial input terminal in synchronization with the clock signal input through the first clock input terminal, subsequent to the shift output of the respective first digital signals, the method comprising:

non-masking a clock signal portion used for shift-outputting the respective first digital signals by the first parallel/serial converting device and masking the remaining clock signal portion, in the clock signal supplied to the first and second parallel/serial converting devices from the clock signal generating circuit, when the apparatus is in a first mode;

non-masking the entire clock signal supplied to the first and second parallel/serial converting devices from the clock signal generating circuit, when the apparatus is in a second mode;

supplying the first operation voltage to the first parallel/serial converting device and not supplying the second operation voltage to the second parallel/serial converting device, in the first mode; and supplying the first and second operation voltages to the first and second parallel/serial converting device, in the second mode.

* * * * *